(12) United States Patent
Pesetski et al.

(10) Patent No.: US 9,780,764 B2
(45) Date of Patent: Oct. 3, 2017

(54) PHASE QUANTUM BIT

(75) Inventors: Aaron A. Pesetski, Gambrills, MD (US); James E. Baumgardner, Odenton, MD (US); Rupert M. Lewis, Laurel, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 2085 days.

(21) Appl. No.: 12/754,194

(22) Filed: Apr. 5, 2010

(65) Prior Publication Data
US 2011/0241765 A1 Oct. 6, 2011

(51) Int. Cl.
H03K 3/38 (2006.01)
H01L 39/24 (2006.01)
H01L 39/22 (2006.01)

(52) U.S. Cl.
CPC ............ H03K 3/38 (2013.01); H01L 39/223 (2013.01); H01L 39/2493 (2013.01); *Y10T 29/49014* (2015.01)

(58) Field of Classification Search
CPC ...... G06N 99/002; H03K 3/38; H01L 39/223; H01L 39/2493
USPC ............................... 257/31; 29/599; 327/528
See application file for complete search history.

(56) References Cited

U.S. PATENT DOCUMENTS

| | | |
|---|---|---|
| 3,758,795 A | 9/1973 | Anacker et al. |
| 2002/0188578 A1 | 12/2002 | Amin et al. |
| 2003/0207766 A1 | 11/2003 | Esteve et al. |
| 2004/0173793 A1 | 9/2004 | Blais et al. |
| 2006/0147154 A1* | 7/2006 | Thom et al. .............. 385/37 |
| 2009/0289638 A1 | 11/2009 | Farinelli et al. |

OTHER PUBLICATIONS

International Search Report for corresponding PCT/US11/30304, completed May 18, 2011 by Lee W. Young of ISA/US.
Sillanpaa, et al.: "*Coherent Quantum State Storage and Transfer Between Two Phase Qubits Via a Resonant Cavity*"; Nature 449. Dec. 27, 2007, p. 438-442 [retrieved on May 18, 2011] Retrieved from <URL: arxiv.org/PS_cache/arxif/pdf/0709/0709.2341v1.pdf>: pg. 2, ¶ 2; p. 3, ¶ 2, 3; p. 14, ¶1.
Extended Search Report for corresponding EP 11 76 6454, dated Mar. 29, 2017.

* cited by examiner

*Primary Examiner* — Anh Mai
(74) *Attorney, Agent, or Firm* — Tarolli, Sundheim, Covell & Tummino LLP

(57) ABSTRACT

A phase quantum bit is disclosed. In one embodiment, the phase quantum bit may comprise a Josephson junction and a distributed element coupled to the Josephson junction. The distributed element provides a capacitive component and an inductive component of the phase quantum bit.

16 Claims, 4 Drawing Sheets

PHASE QUANTUM BIT

TECHNICAL FIELD

The present invention relates generally to superconductor circuits, and more particularly to a phase quantum bit.

BACKGROUND

A phase quantum bit is essentially an LC resonator and can be formed from an inductor shunting a Josephson junction. The physical Josephson junction consists of two parts, an ideal Josephson junction and a shunting capacitor. The shunting capacitor can be supplied by the capacitance of the Josephson junction and the inductance can be supplied by the parallel combination of the inductor and the dynamic inductance of the junction. A control circuit is employed to write to the phase quantum bit and a readout circuit is employed to read from the phase quantum bit. The coherence time of the quantum bit is determined in part by the quality factor (Q) of the resonant circuit. Since the control and readout circuits are coupled to the resonant circuit, they load the circuit and reduce the quality factor (Q). In addition, any noise present in the control or readout circuits couples directly to the resonant circuit resulting in decoherence.

A well established technique within the quantum computing community for reducing decoherence resulting from dielectric loss associated with Josephson junctions is to replace the internal capacitance of the Josephson junction with an explicit external capacitor. This can be accomplished by substantially increasing the critical current density of the junction and reducing its area to maintain a constant critical current. As a result, the dynamic inductance of the junction remains constant, but the capacitance is reduced substantially. The missing capacitance is made up with an external shunt capacitor. While this technique can improve poor performance caused by lossy junctions, it does nothing to improve poor performance caused by coupling to control and readout circuits.

SUMMARY

In one aspect of the invention, a phase quantum bit is provided. The phase quantum bit may comprise a Josephson junction and a distributed element coupled to the Josephson junction. The distributed element provides a capacitive component and an inductive component of the phase quantum bit.

In another aspect of the invention, a quantum circuit is provided. The quantum circuit comprises a phase quantum bit comprising a Josephson junction and a transmission line coupled to the Josephson junction, a control circuit coupled to the transmission line for biasing the phase quantum bit and a readout circuit coupled to the transmission line for reading the phase quantum bit. The transmission line provides a capacitive component and an inductive component of the phase quantum bit. A shunt impedance is coupled to a second end of the transmission line with a first end of the transmission line being coupled to the Josephson junction.

In yet another aspect of the present invention, a method of forming a phase quantum bit is provided. The method comprises forming a Josephson junction, forming a distributed element that provides a capacitive component and an inductive component of the phase quantum bit and coupling a first end of the distributed element to the Josephson junction.

DETAILED DESCRIPTION

A superconductor phase quantum bit is provided that includes a distributed element coupled to a Josephson junction. The distributed element can replace a shunting capacitor and a shunting inductor. The phase quantum bit can employ a technique of shrinking the Josephson junction to reduce the internal capacitance of the junction but, rather than adding an external shunting capacitor, a distributed element such as a transmission line resonator is employed to provide the necessary capacitance of the phase quantum bit. The length of the transmission line supplies both the missing capacitive component and the shunt inductive component needed to complete the circuit. A shunting impedance can be coupled to the distributed element to provide increased tunability and/or increase the quality factor (Q) of the phase quantum bit. The working definition of the quality factor (Q) of the phase quantum bit is defined as the bandwidth of the resonator divided by the center frequency of the resonator. The text book definition of the quality factor (Q) of the phase quantum bit is defined as $2\pi$ times (the energy stored in the resonator divided by the energy loss in one cycle). Both definitions apply in aspects of the present invention.

Figure 1:
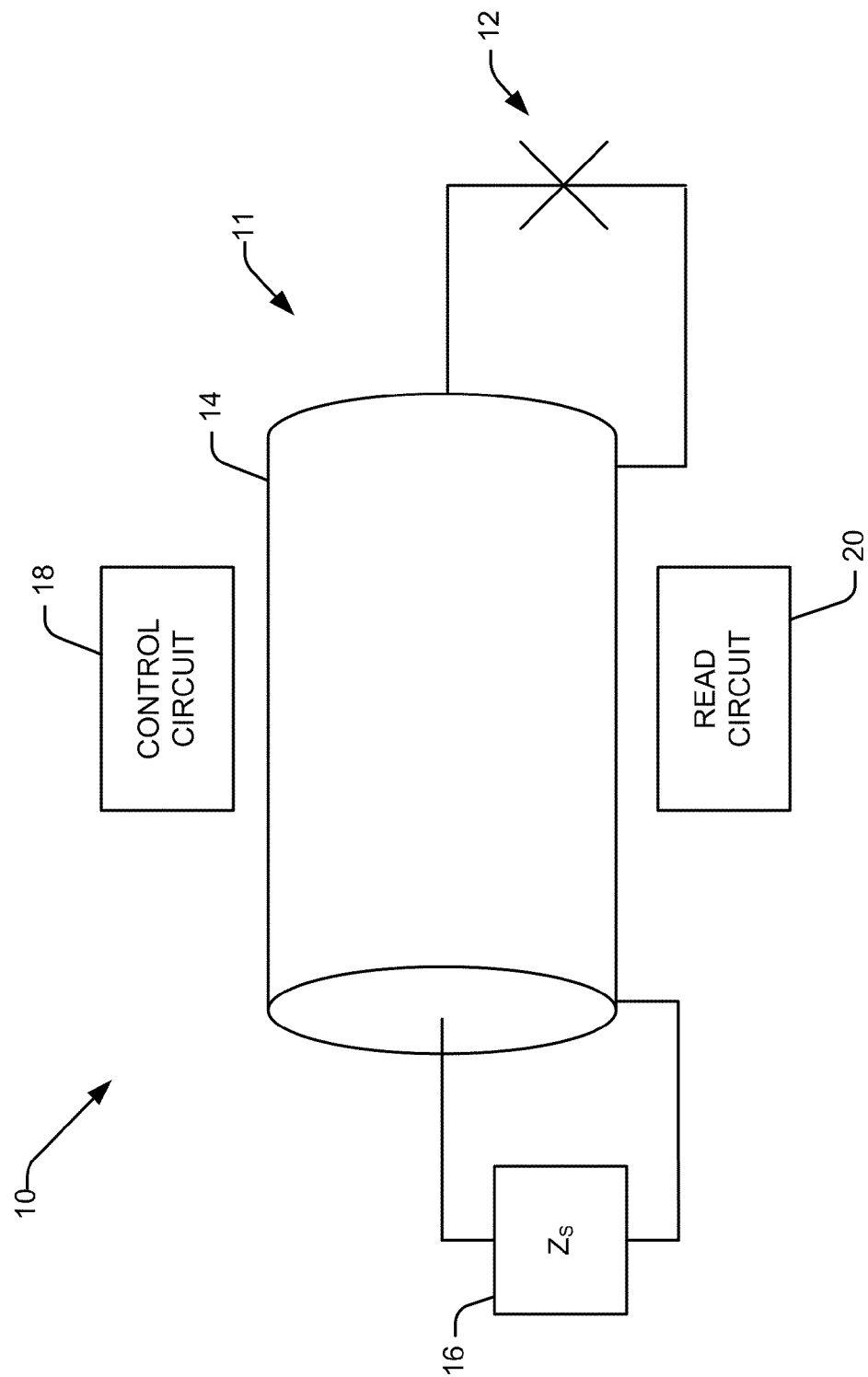
FIG. 1 illustrates a schematic diagram of a superconductor quantum circuit in accordance with an aspect of the present invention.

FIG. 1 illustrates a schematic diagram of a superconductor quantum circuit 10 in accordance with an aspect of the present invention. The superconductor quantum circuit 10 includes a superconducting phase quantum bit 11 formed from a distributed element 14 coupled in parallel or shunted with a Josephson junction 12. The Josephson junction 12 can be of a reduced size to minimize the internal capacitance of the Josephson junction 12. The distributed element 14 can be a transmission line such as a coplanar waveguide, a slot line waveguide, a stripline waveguide, a microstrip waveguide or other type of transmission line geometry or a complex distributed filter. The phase quantum bit 11 can also include a shunting impedance Zs 16 coupled to and in parallel with the distributed element 14. In one aspect of the invention, Zs is a short circuit. However, Zs could be any arbitrary reactive network, including an open circuit, an inductor, a capacitor, a Josephson junction, a transmission line or a combination thereof.

The shunting impedance increases tunability and/or the quality factor (Q) of the phase quantum bit. For example, the use of a capacitor as the shunting impedance increases tunability but decreases the Q of the phase quantum bit. The use of an inductor as the shunting impedance decreases the tunability but increases the Q, while the use of another transmission line (e.g., of a different width) increases the tunability and increases the Q of the phase quantum bit.

The superconductor quantum circuit 10 also includes a control circuit 18 that is magnetically coupled to the distributed element 14. The control circuit 18 applies a bias current to the phase quantum bit 11 to tune the frequency of the phase quantum bit 11 and set its state. The superconductor quantum circuit 10 also includes a readout circuit 20 that is magnetically coupled to the distributed element 14. The readout circuit 20 reads the magnetic flux state of the phase quantum bit 11 to determine if the phase quantum bit 11 contains a photon.

Figure 2:
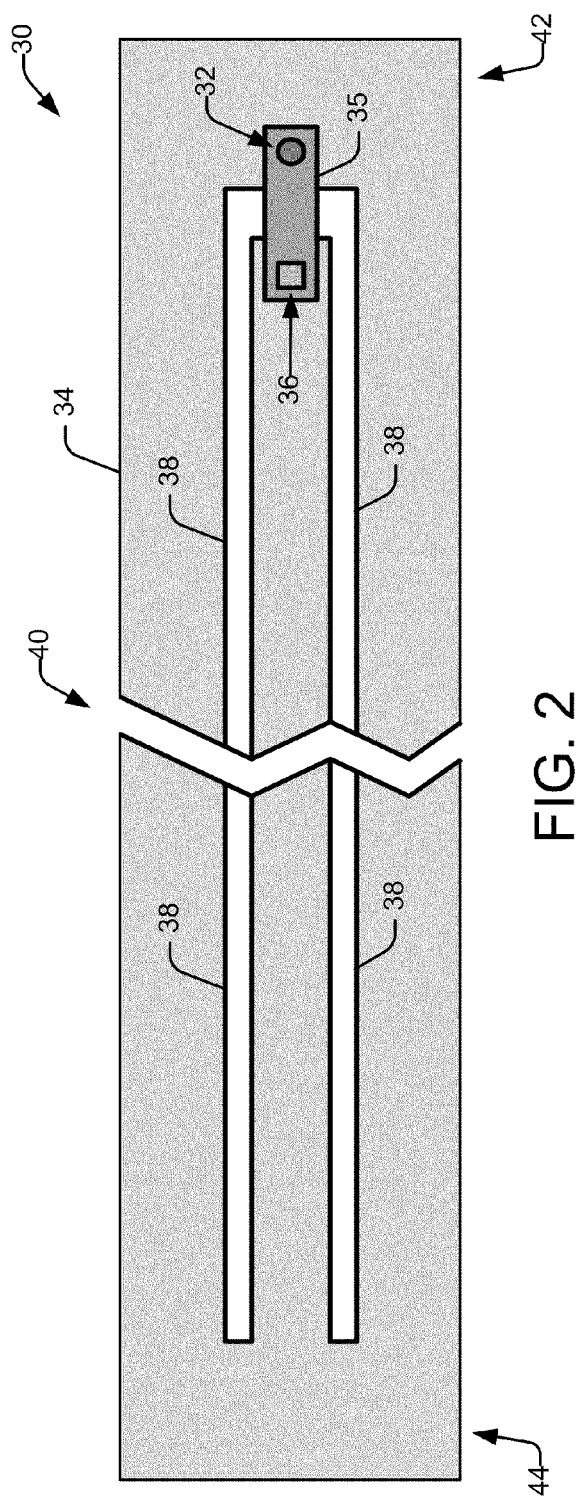
FIG. 2 illustrates a top view with a cutout portion of a phase quantum bit that employs a transmission line coupled to a Josephson junction in accordance with an aspect of the present invention.

FIG. 2 illustrates a top view with a cutout portion 40 of a phase quantum bit 30 that employs a transmission line 34 coupled to a Josephson junction 32 in accordance with an aspect of the present invention. The cutout portion is employed to illustrate that the length of the transmission line 34 is substantially greater than the width of the transmission line 34 and further provide views of a first end 42 of the transmission line 34 and a second end 44 of the transmission line 34. For example, the length of the transmission line can be about 5000 microns long while the width of the transmission line can be about 20 microns wide. The transmission line 34 is a coplanar waveguide 34 which can be fabricated using a single metal layer with open portion 38 to form the waveguide 34. The coplanar waveguide is a gradiometer configuration making it less susceptible to coupling to external magnetic fields. It is to be appreciated that other transmission line geometries can be employed to form the phase quantum bit 30. The transmission line 34 is used to form the resonator with the first end 42 that shunts the Josephson junction 32 and the second end 44 that is shorted to provide the shunting impedance.

The Josephson junction 32 can be formed on a first layer with the transmission line 34 being formed on a second layer. A contact 36 that extends through an intermediate layer couples to the Josephson junction 32 through a conductive line 35 and to the first end 42 of the transmission line 34. The second layer can overly the first layer or the first layer can overly the second layer. The first layer can be formed of multiple layers since the Josephson junction is formed of a dielectric layer sandwiched between two superconductor layers.

Figure 3:
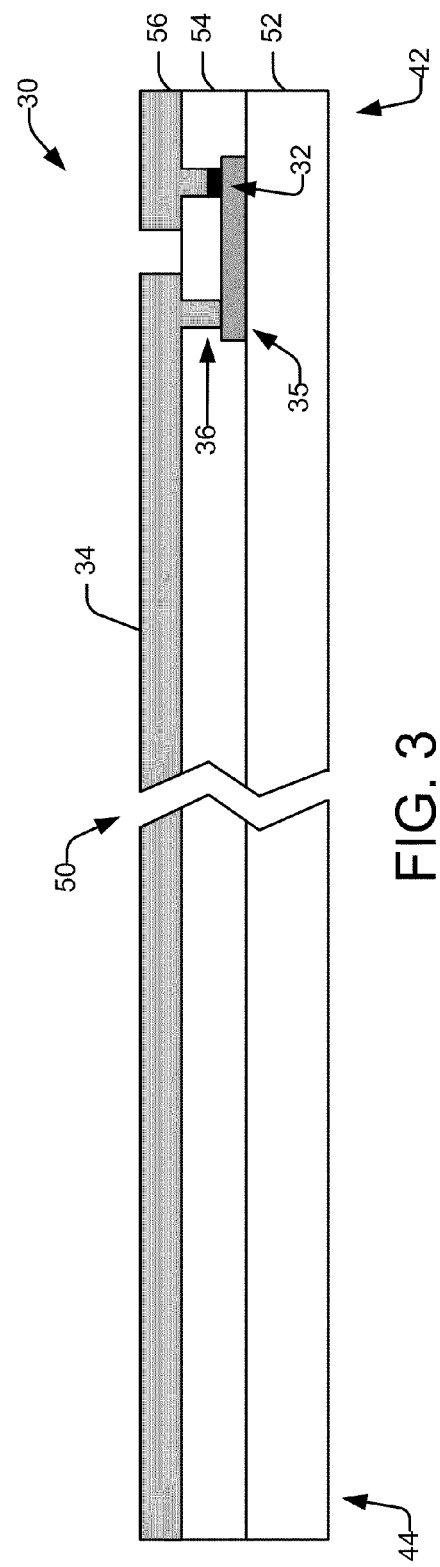
FIG. 3 illustrates a cross-sectional view with a cutout portion of the phase quantum bit of FIG. 2 in accordance with an aspect of the present invention.

FIG. 3 illustrates a cross-sectional view with a cutout portion 50 of the phase quantum bit 30 of FIG. 2 in accordance with an aspect of the present invention. The phase quantum bit 30 is formed over a substrate layer 52. An intermediate layer 54 overlies the substrate layer 52. The Josephson junction 32 resides in the intermediate layer 54 and is formed of a dielectric layer sandwiched between two superconducting layers. The conductive line 35 extends from the Josephson Junction 32 to the contact 36 that extends through the intermediate layer 54 to a top layer 56 that includes the transmission line 34. A variety of processing techniques can be employed to form the phase quantum bit 30.

For example, a metal-insulator-metal trilayer consisting of two superconducting metal layers separated by a thin dielectric layer can be deposited over the substrate and etched halfway through to define the Josephson junction 32. A different mask can be employed to etch the trilayer to define the conductive line 35 and an insulating layer can be deposited over the structure to form the intermediate layer 54. The intermediate layer 54 can be etched to form the contact 36 and the top of the Josephson junction 32. The metal layer 56 can be deposited over the intermediate layer 54 and etched to form the transmission line 34 with the first end of the transmission line 34 coupled to the contact 36.

Figure 4:
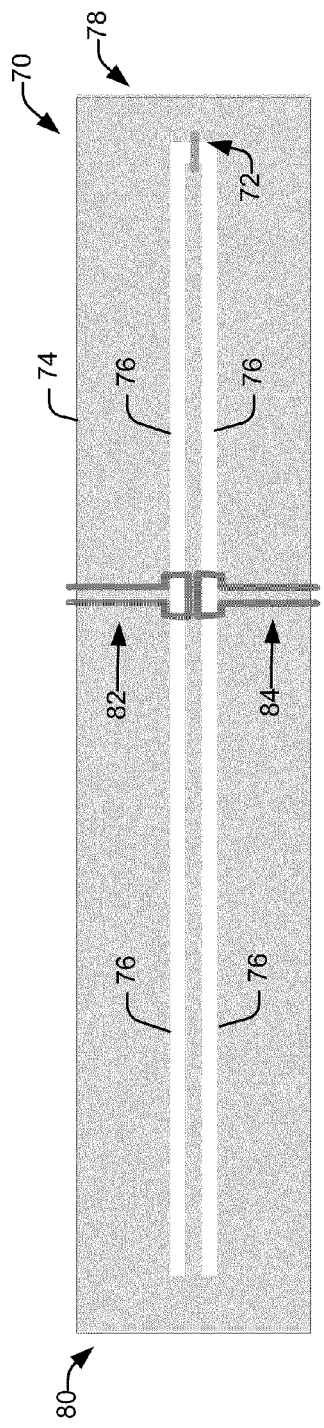
FIG. 4 illustrates a top view of a phase quantum bit configured to reduce susceptibility to noise caused by control and readout circuitry in accordance with an aspect of the present invention.
Figure 5:
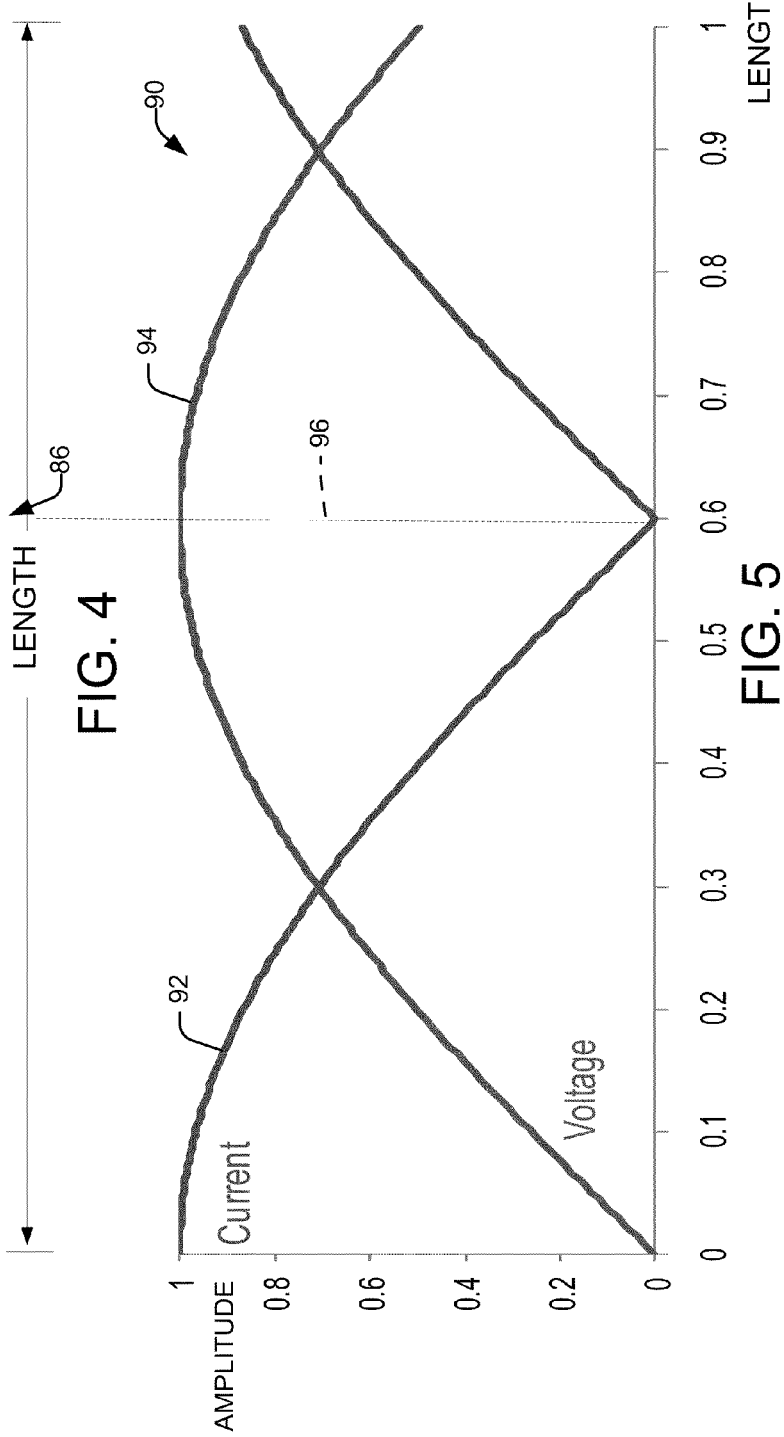
FIG. 5 is a plot of the RF voltage amplitude and current amplitude along the length of and aligned with the length of the transmission line of FIG. 4 in accordance with an aspect of the present invention.

FIG. 4 illustrates a top view of a phase quantum bit 70 configured to reduce susceptibility to noise caused by control and readout circuitry in accordance with an aspect of the present invention. The phase quantum bit 70 of FIG. 4 has a similar layout to the phase quantum bit 30 of FIG. 2 in which a transmission line 74 with open portions 76 in the form of a coplanar waveguide is used to form the resonator with a first end 78 that shunts a Josephson junction 72 and second end 80 that is shorted. FIG. 5 is a plot 90 of the RF voltage amplitude 94 and current amplitude 92 along the length of and aligned with the length of the transmission line 74. Since the second end 80 is a short, it is a voltage node with the current being at its maximum. The first end 78, which shunts the Josephson junction 72, is almost a voltage node, with the current rising to about 85% of its maximum value. Toward the middle of the transmission line 74, at about 40% from the first end 78 is a current node at a zero RF current location 86 (see dash line 96) where the RF current and thus the RF magnetic field drops to zero. A readout circuit 84 and a control circuit 82 are designed to produce and measure DC magnetic field. By inductively coupling the readout circuit 84 and the control circuit 82 at the zero RF current location 86, the readout circuit 84 and the control circuit 82 are only weakly coupled to the RF field and thus do not load the Q of the resonator. In addition, any RF noise in the readout and control circuits 84 and 82 will be unable to decohere the quantum bit.

It is to be appreciated that the resonant frequency varies more slowly with applied flux in the phase quantum bit of FIG. 4. While this is a disadvantage in that it means the quantum bit may be less tunable, it is an advantage in that the quantum bit is less sensitive to low frequency noise coupling that causes decoherence.

Figure 6:
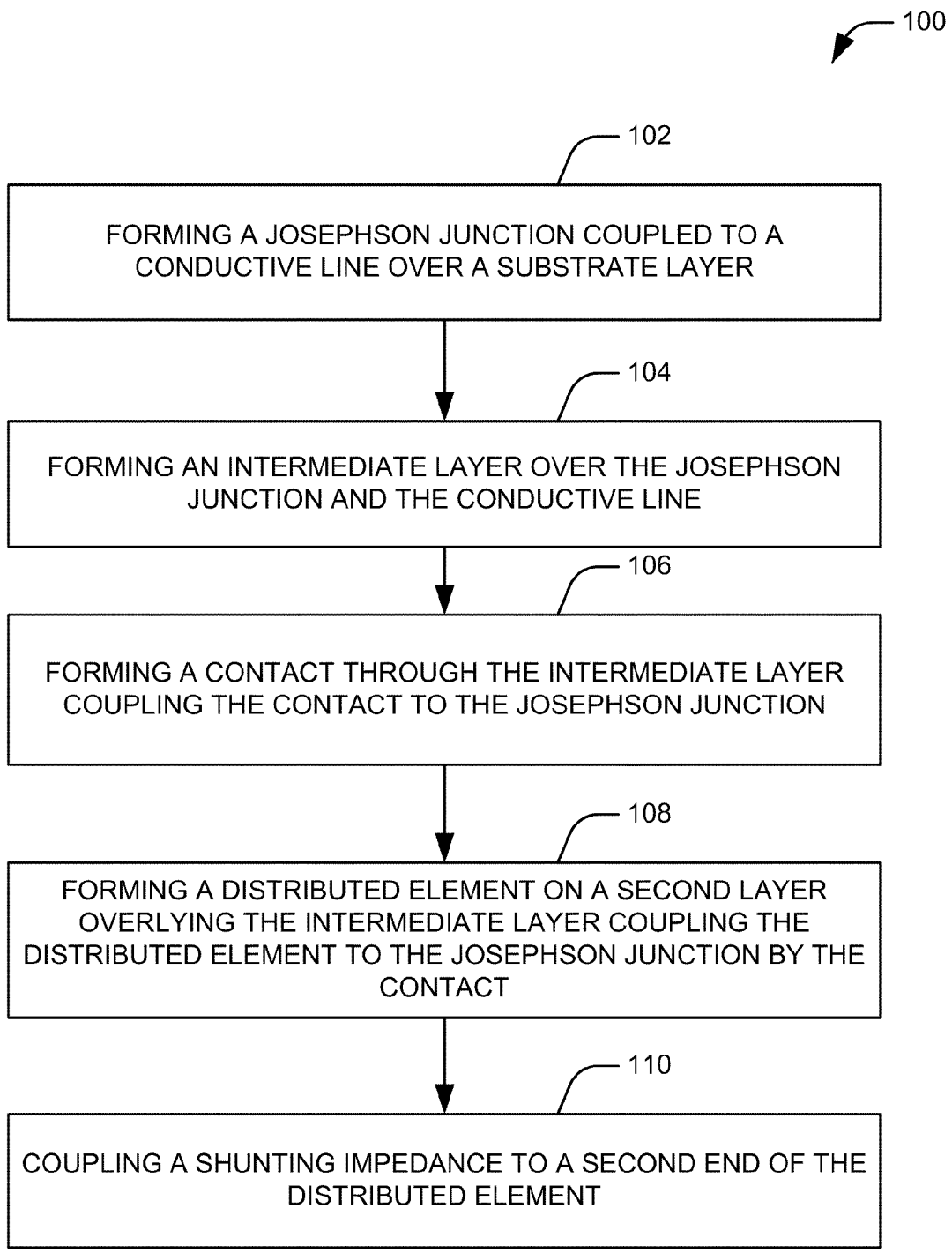
FIG. 6 illustrates an example of a method for forming a phase quantum bit in accordance with an aspect of the present invention.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 100 for forming a phase quantum bit in accordance with an aspect of the present invention. At 102, a Josephson junction coupled to a conductive line is formed over a substrate layer. At 104, an intermediate layer is formed over the Josephson junction and the conductive line. The intermediate layer can be a dielectric layer. At 106, a contact is formed through the intermediate layer to the conductive line to provide a contact from the Josephson junction to the top of the intermediate layer. At 108, a distributed element is formed on a second layer overlying the intermediate layer with a first end of the distributed element being coupled to the Josephson junction by the contact. At 110, a shunting impedance is coupled to a second end of the distributed element. The shunting impedance can be any arbitrary reactive network, including a short circuit, an open circuit, an inductor, a capacitor, a Josephson junction, a transmission line or a combination thereof.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A phase quantum bit comprising:
   a Josephson junction;
   a distributed element coupled to the Josephson junction, the distributed element providing a capacitive component and an inductive component of the phase quantum bit; and
   a control circuit coupled to the distributed element for biasing the phase quantum bit and a readout circuit coupled to the distributed element for reading the phase quantum bit, wherein the control circuit and/or the readout circuit are coupled to the distributed element at a location where the magnitude of the radio frequency (RF) current is approximately zero.

2. The phase quantum bit of claim 1, wherein the distributed element is a transmission line.

3. The phase quantum bit of claim 2, wherein the transmission line is one of a coplanar waveguide, a slot line waveguide, a stripline waveguide and a microstrip waveguide.

4. The phase quantum bit of claim 1, further comprising a shunting impedance coupled to a second end of the distributed element with a first end of the distributed element being coupled to the Josephson junction.

5. The phase quantum bit of claim 4, wherein the shunting impedance is a short.

6. The phase quantum bit of claim 4, wherein the shunting impedance is an open.

7. The phase quantum bit of claim 4, wherein the shunting impedance is at least one of a capacitor, an inductor, a transmission line and a second Josephson junction.

8. A quantum circuit comprising:
   a phase quantum bit comprising:
   a Josephson junction;
   a transmission line coupled to the Josephson junction, the transmission line providing a capacitive component and an inductive component of the phase quantum bit; and
   a shunt impedance coupled to a second end of the transmission line with a first end of the transmission line being coupled to the Josephson junction; and
   a control circuit coupled to the transmission line for biasing the phase quantum bit; and
   a readout circuit coupled to the transmission line for reading the phase quantum bit
   wherein the control circuit and the readout circuit are coupled to the transmission line at a location where the magnitude of the radio frequency (RF) current is approximately zero.

9. The quantum circuit of claim 8, wherein the transmission line is one of a coplanar waveguide, a slot line waveguide, a stripline waveguide and a microstrip waveguide.

10. The quantum circuit of claim 8, wherein the shunting impedance is a short at the second end of the transmission line.

11. The quantum circuit of claim 8, wherein the shunting impedance is an open at the first end of the transmission line.

12. The quantum circuit of claim 8, wherein the shunting impedance is at least one of a capacitor, an inductor, a transmission line and a second Josephson junction.

13. A method of forming a phase quantum bit, the method comprising:
   forming a Josephson junction;
   forming a distributed element that provides a capacitive component and an inductive component of the phase quantum bit;
   coupling a first end of the distributed element to the Josephson junction;
   forming a control circuit coupled to the distributed element adjacent a first location for biasing the phase quantum bit; and
   forming a readout circuit coupled to the distributed element adjacent the first location for reading the phase quantum bit, wherein the first location is at a location where the magnitude of the radio frequency (RF) current of the phase quantum bit is approximately zero.

14. The method of claim 13, wherein the forming a distributed element comprises forming a second end of the distributed element that is shorted.

15. The method of claim 13, further comprising forming a shunting impedance coupled to a second end of the distributed element, wherein the shunting impedance is at least one of an open circuit, a capacitor, an inductor, a transmission line and a second Josephson junction.

16. The method of claim 13, further comprising forming an intermediate layer between the Josephson junction and the distributed element and forming a contact through the intermediate layer to couple the Josephson junction to the distributed element.

* * * * *